United States Patent
Zhao et al.

(10) Patent No.: US 10,079,191 B2
(45) Date of Patent: Sep. 18, 2018

(54) HEAT SPREADER HAVING THERMAL INTERFACE MATERIAL RETAINMENT

(71) Applicant: Avago Technologies General IP (Singapore) Pte. Ltd., Singapore (SG)

(72) Inventors: Sam Ziqun Zhao, Irvine, CA (US); Rezaur Rahman Khan, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/928,765

(22) Filed: Oct. 30, 2015

(65) Prior Publication Data

US 2017/0110384 A1 Apr. 20, 2017

Related U.S. Application Data

(60) Provisional application No. 62/242,768, filed on Oct. 16, 2015.

(51) Int. Cl.
*H01L 23/34* (2006.01)
*H01L 23/367* (2006.01)

(52) U.S. Cl.
CPC .................................. *H01L 23/367* (2013.01)

(58) Field of Classification Search
CPC ...................................................... H01L 23/367
USPC ........................................................... 257/713
See application file for complete search history.

(56) References Cited

U.S. PATENT DOCUMENTS

2013/0188319 A1* 7/2013 Yamaguchi .......... H05K 7/2039
361/717

* cited by examiner

*Primary Examiner* — Hsin-Yi Hsieh
(74) *Attorney, Agent, or Firm* — Sterne, Kessler, Goldstein & Fox P.L.L.C.

(57) ABSTRACT

In embodiments described herein, an integrated circuit (IC) package is provided. The IC package may include a substrate, an IC die, and a heat spreader. The IC die may have opposing first and second surfaces, where the first surface of the IC die is coupled to a surface of the substrate. The heat spreader may have a surface coupled to the second surface of the IC die by a thermal interface (TI) material. The surface of the heat spreader may have a micro-recess which may include a micro-channel or a micro-dent to direct a flow of TI material towards or away from a predetermined area of the second surface of the IC die based on temperatures of the substrate, the IC die, and/or the heat spreader.

20 Claims, 7 Drawing Sheets

HEAT SPREADER HAVING THERMAL INTERFACE MATERIAL RETAINMENT

CROSS REFERENCE TO RELATED APPLICATIONS

This application claims the benefit of U.S. Provisional Application No. 62/242,768, filed Oct. 16, 2015, which is incorporated herein by reference in its entirety.

BACKGROUND

Field of Technology

Embodiments described herein generally relate to integrated circuit (IC) device packaging technology.

Background

Conventional IC packaging includes thermal interface (TI) material which is used between a heat spreader and an IC die to provide heat transfer from the IC die to the heat spreader. The TI material reduces thermal contact resistance between the heat spreader and the IC die which allows heat from the IC die to dissipate by way of the heat spreader.

During chip packaging, board assembly, or use of the IC, temperature changes can cause the heat spreader and a substrate on which the IC die is positioned to warp and flex. Because of the warping and flexing, the TI material may be squeezed off of the IC die and create cavities and voids between the heat spreader and the IC die. The cavities and/or voids may reduce heat dissipation between the IC die and the heat spreader and may cause the IC to fail.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1A:
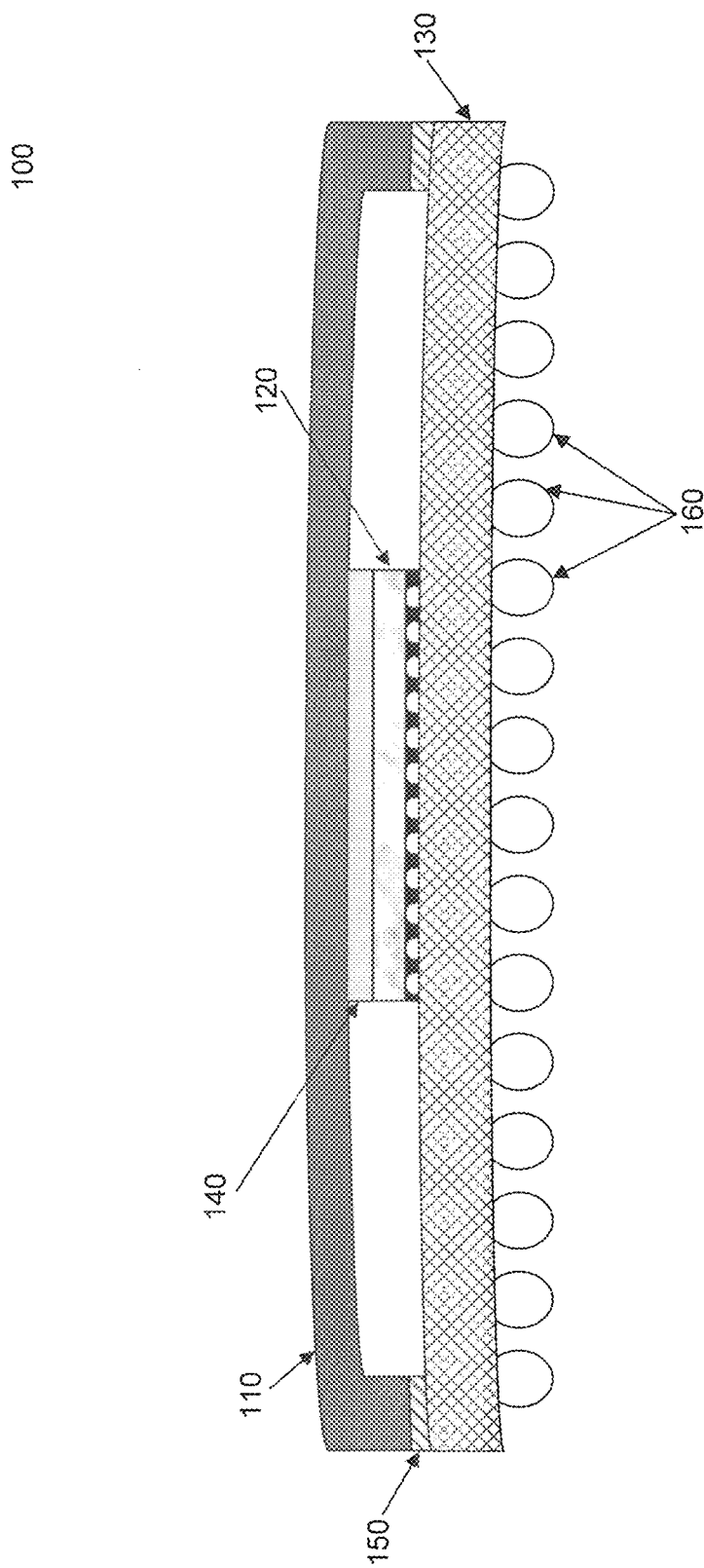
FIG. 1A illustrates a cross-sectional view of a conventional IC package.

FIG. 1A illustrates a cross-sectional view of a conventional integrated circuit (IC) package 100. The conventional IC package 100 includes a heat spreader 110, a die 120, and a substrate 130. The heat spreader 110 dissipates heat created by the die 120 away from the die 120. To dissipate heat from the die 120, the heat spreader 110 may be made of a highly thermal conductive material such as copper or aluminum. Furthermore, a thermal interface (TI) material 140 may be used between the heat spreader 110 and the die 120. The TI material 140 is used to reduce the thermal contact resistance between the heat spreader 110 and the die 120. Therefore, the TI material 140 may be any material which increases the transfer of heat from the die 120 to the heat spreader 110. Examples of the TI material 140 may include pressure-sensitive adhesive tapes, thermal adhesives or thermal epoxies such as SE4450, Dow Corning® DA-6534, thermal greases, thermal gels such as X23-7772-4, thermal pastes or liquids, elastomeric pads, phase change materials, graphite, low melting point liquid metals and alloys such as bismuth-base allow or solders, or compressible interface materials.

In embodiments, the heat spreader 110 also contacts the substrate 130 to create a sealed area between the heat spreader 110 and the substrate 130. An adhesive material 150 may be used to seal and secure the heat spreader 110 to the substrate 130 thereby making the heat spreader 110 an integral part of the IC package 100. The IC package 100 may also include solder balls 160 that are deposited on a surface of the substrate 130 for mounting or connecting the IC package 100 to external circuitry (not shown).

During a manufacturing process of the die 120, a backside of the die 120 is grinded and polished so as to be substantially flat. Typically, a bottom surface of the heat spreader 110 is likewise made flat and smooth to match the flat backside surface of the die 120. In theory, the matching flat surfaces of the heat spreader 110 and the die 120 provide an ideal contact area for heat dissipation. However, during a heating and cooling event, changes in temperature between the heat spreader 110, the die 120, and/or the substrate 130 can cause warping and flexing between the surfaces of the heat spreader 110 and the die 120. The heating and cooling event may occur during package and board assembly or during the intended operation of the IC package 100.

For example, during a typical packaging and board assembly process, the solder balls 160 may be mounted to the substrate 130 by heating the IC package 100 to temperatures up to 260° C. and then allowing the IC package 100 to cool down to ambient temperature. As another example, the IC package 100 may heat up during intensive computation and activity levels of the die 120 and cool down during less computation and activity levels of the die 120. The die 120 may have an ambient temperature of 25° C. but may reach a temperature as high as 125° C. during high computational and activity levels. Accordingly, the IC package 100 may experience extreme temperature changes which affect the heat spreader 110, the die 120, and the substrate 130.

Further, because the heat spreader 110, the die 120, and the substrate 130 are made of different materials, each of these components of the IC package 100 expand and contract differently during a heating and cooling process. The difference in the expansion and contraction of the different materials may be described by the different thermal expansion coefficients for each of these materials. The thermal expansion coefficient is the ratio by which a material expands according to a change in temperature. For example, the heat spreader 110 may be formed by copper which has a thermal expansion coefficient of about 17 ppm/° C., an organic substrate 130 may have a thermal expansion coefficient of 13~17 ppm/° C., and silicon 120 has a thermal expansion coefficient of 2.9 ppm/° C. Therefore, in this example, the heat spreader 110 and the substrate 130 may expand/contract five to six times as much as the silicon 120 and therefore warp or flex significantly more during a heating and cooling process.

Figure 1B:
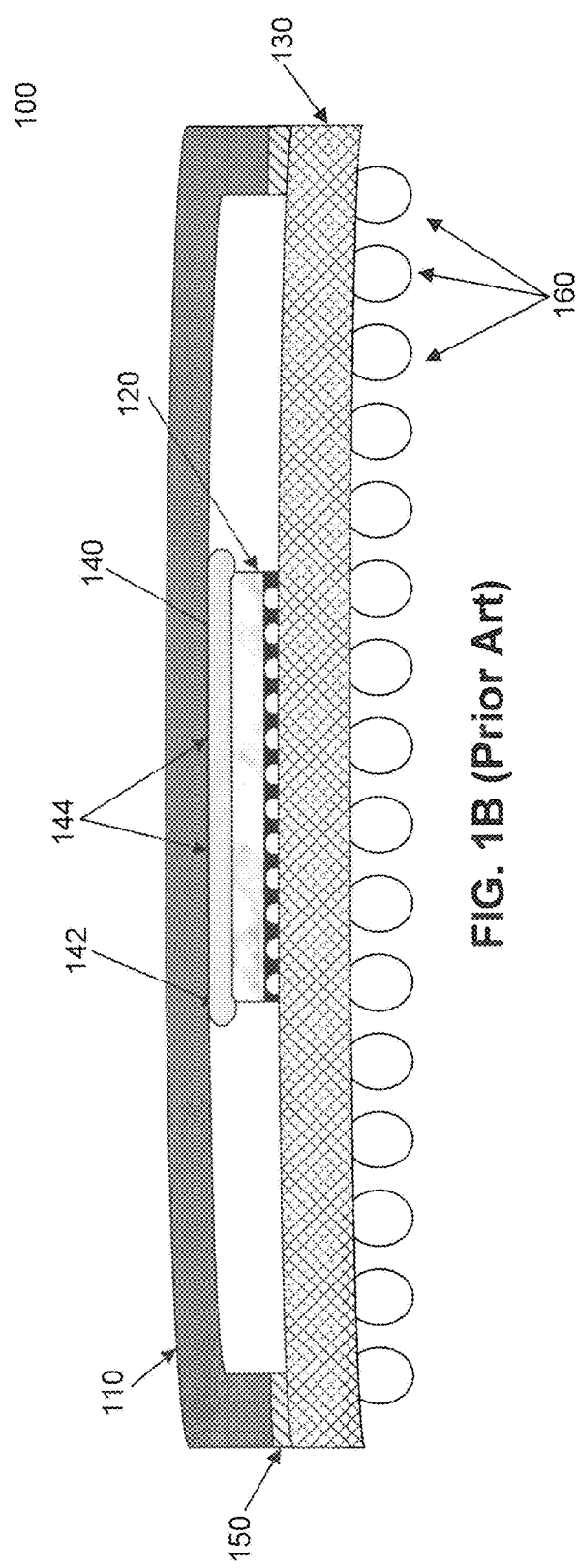
FIG. 1B illustrates another cross-sectional view of a conventional IC package.

Moreover, the warping and flexing of the heat spreader 110 and the substrate 130 can change a contact surface and spacing between the heat spreader 110 and the die 120. FIG. 1B illustrates another cross-sectional view of a conventional IC package 100 caused by a heating and cooling event. As illustrated, FIG. 1B depicts the effects of warping and flexing of the heat spreader 110 and the substrate 130. In this example, the changed contact surface and spacing causes an overflow 142 of the TI material 140 outside of a footprint area of the die 120. In other words, the temperature changes may cause the TI material 140 to be squeezed outside of the footprint area of the die 120 and may cause the overflow 142 of TI material 140 around the edges of the die 120. The changed contact surface and spacing may further cause cavities or voids 144 between the heat spreader 110 and the die 120 because of the lack of TI material 140 within the footprint area of the die 120. In other words, the portion(s) of the TI material 140 can result in voids (e.g. lack of consistent TI material) to occur at various locations 144 at the interface between the heat spreader 110 and the die 120. Further, the flat and smooth surface of the heat spreader 110 precludes the retention of the TI material 140 and does not facilitate the TI material 140 to flow back within the footprint area of the die 120, thus, leaving randomly distributed cavities and/or voids 144 between the heat spreader 110 and the die 120.

The cavities and/or voids 144 may prevent effective transfer of heat from the die 120 to the heat spreader 110. For example, the thermal conductivity is approximately 0.026 W/(m° C.) for air and approximately 25-400 W/(m° C.) for TI materials. Accordingly, areas without cavities and/or voids 144 dissipate heat from the die 120 to the heat spreader 110 at least 1000 times better than areas which include cavities and/or voids 144.

Figure 1C:
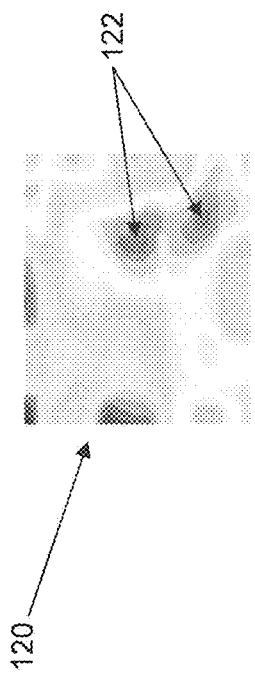
FIG. 1C illustrates an example of thermal hotspots on a footprint area of an IC die.

Additionally, in a conventional IC package 100, a thermal hotspot 122 may form on the die 120. A thermal hotspot is an area of high temperature caused by situations such as higher power densities at various areas on a die 120. FIG. 1C illustrates an example of thermal hotspots 122 on a footprint area of a die. One or more thermal hotspots 122 may be formed in the same location as the cavities and/or voids 144 in the TI material. When the thermal hotspots 122 are formed in the same location as the cavities and/or voids 144, the IC may have a higher probability of failure due to poor heat dissipation from the thermal hotspots 122.

According to embodiments of the disclosure described herein, the heat spreader is fabricated to include one or more micro-recesses, such as a micro-channel or a micro-dent, to improve the retention of TI material located between a head spreader and a die.

Figure 2A:
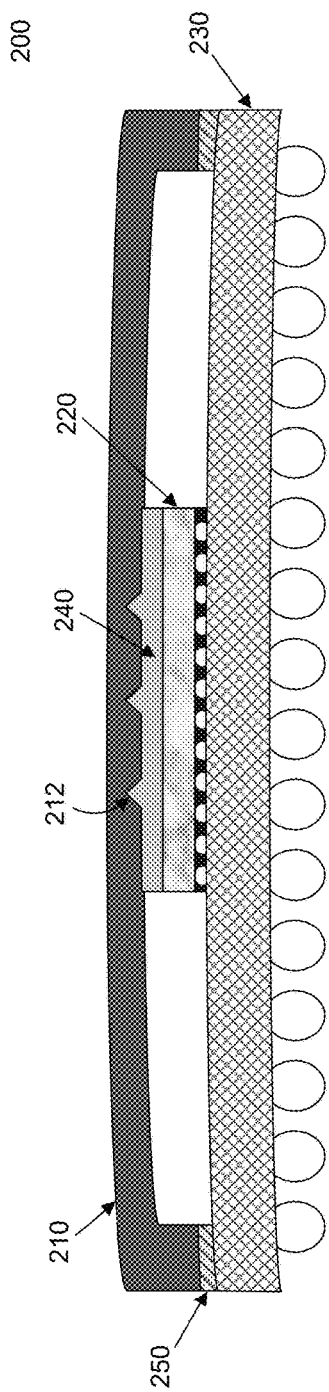
FIG. 2A illustrates a cross-sectional view of an IC package having micro-channels in accordance with embodiments of the present disclosure.

For example, FIG. 2A illustrates a cross-sectional view of an IC package 200 having micro-channels in accordance with embodiments of the present disclosure. The IC package 200 of FIG. 2A includes a heat spreader 210, a die 220, and a substrate 230. The heat spreader 210, the die 220, and the substrate 230 may be formed of the same, or similar materials, as the heat spreader 110, the die 120, and the substrate 130, as described in regards to FIGS. 1A and 1B. Accordingly, further discussion on these materials is left out to avoid repetition.

Thermal contact between the heat spreader 210 and the die 220 is improved by use of TI material 240 and contact between the heat spreader 210 and the substrate 230 is sealed by use of the adhesive material 250. Both the TI material 240 and the adhesive material 250 may be the same, or similar, materials as to the TI material 140 and the adhesive material 150, respectively, as described in regards to FIGS. 1A and 1B. Accordingly, further discussion on these materials is left out to avoid repetition.

As shown in in FIG. 2A, the heat spreader 210 may include a plurality of micro-channels 212 to improve the flow of TI material 240 towards or away from a predetermined area. For example, a micro-channels 212 can be a groove that is etched or cut into the material of the heat spreader 210 on the surface abutting the die 220, as is shown in FIG. 2A. The micro-channel 212 allows TI material 240 to flow into and/or away from the predetermined area of the die 220.

Figure 2B:
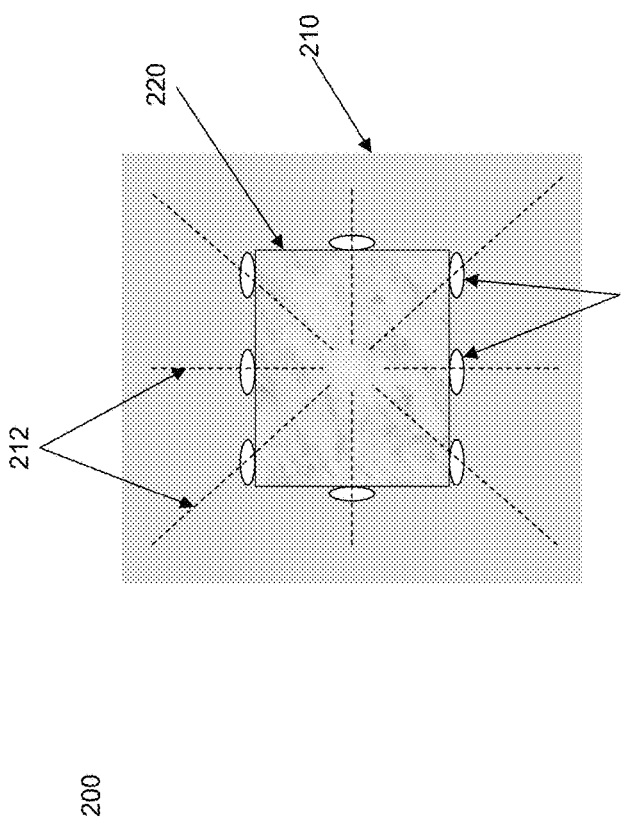
FIG. 2B illustrates a top-down sectional view of the IC package of FIG. 2A in accordance with embodiments of the present disclosure.

FIG. 2B illustrates a top-down view of an IC package 200 in accordance with embodiments of the present disclosure. The heat spreader 210 includes the micro-channels 212, as shown by FIG. 2B, which are strategically patterned based on a desire to have TI material 240 flow into and/or away from the predetermined area of the die 220. While FIG. 2B illustrates a heat spreader 210 having eight micro-channels 212, the heat spreader 210 may include a single micro-channel 212 which extends away from a predetermined area on the die 220 or any number of micro-channels 212 to facilitate the flow of the TI material 240.

A description of how the micro-channels 212 affect the flow of the TI material 240 is now discussed. FIG. 2B illustrates the micro-channels 212 which extend from a center area of the die 220, which is the predetermined area in FIG. 2B. As a temperature of the IC package 200 changes during a heating and/or cooling event, the heat spreader 210 and the substrate 230 may expand and contract. Because the adhesive material 230 bonds the edges of the heat spreader 210 to the substrate 230, the heat spreader 210 may tend to warp and flex in the center area of the die 220. The warping and flexing of the heat spreader 210 may create cavities and/or voids or an overflow of the TI material 240 because the TI material 240 can be squeezed out, as discussed above. However, the micro-channels 212 facilitate the flow of the TI material 240 and allow the TI material 240 to flow towards and/or away from the center area of the die 220 depending on the pressure created by the warping and flexing.

For example, as the temperature of an IC package 200 heats up, the heat spreader 210 heats up and expands more than the expansion of the substrate 230. As the heat spreader 210 expands, it may separate from the die 220 because the edges of the heat spreader 210 are bonded to the substrate 230. Further, a negative pressure is created as the heat spreader 210 separates from the die 220. In turn, the negative pressure creates a vacuum which draws or pulls the TI material 240 through the micro-channels 212 towards the center area of the die 220. Accordingly, the center area can be filled with the TI material 240 instead of creating cavities and/or voids.

Conversely, as the temperature of the IC package 200 cools down, the heat spreader 210 also cools down and contracts which causes the heat spreader 210 to move closer to the die 220. Accordingly, the heat spreader 210 may contract towards the die 220 in such a way that a positive pressure is created on the TI material 240. Upon creating the positive pressure, the TI material 240 can be squeezed or pushed through the micro-channels 212 away from the center of the die 220. The micro-channels 212 will reduce an amount of the TI material 240 at the center of the die 220. The TI material 240 can be squeezed or pushed to an area outside of the center of the die 220 such as to the edge of the die 220, thus creating a reservoir 242 of the TI material 240 which may be drawn back into the micro-channels 212 when a negative pressure is created during package heating, as described above. The micro-channels 212 reduce the amount of overflow of the TI material 240 around an entire edge of the die 220 but provide a path and the reservoir 242 for the TI material 240 to flow towards and away from a predetermined area of the die 220.

The micro-channels 212 provide a mechanism for the TI material 240 to flow toward the die 220 footprint area during a heating event experienced by the IC package 200, and away from the die 220 footprint area during a cooling event experienced by the IC package 200. Accordingly, the TI material 240 in FIG. 2B will flow toward and away from the center area of die 220 over cycles of heating and cooling of the IC package 200, with any excess being stored in the reservoirs 242. Importantly, the TI material 240 flows toward the center area of the die 240 during a heating event due to the negative pressure (or vacuum) described above.

According to embodiments of the present disclosure, the micro-channels 212 may be textured. The textured surface of the micro-channels 212 provide a mechanism to encourage or facilitate the flow of the TI material 212 into a predetermined area of the die 220 and discourage the flow of the TI material 212 away from a predetermined area of the die 220. For example, the textured surface of the micro-channels may include a teeth like texture on the interior surface of the micro-channels, which creates a low amount of resistance for the TI material 212 to flow into a predetermined area of the die 220, and creates a high amount of resistance for the TI material 212 to flow away from the predetermined area of the die 220.

Figure 3:
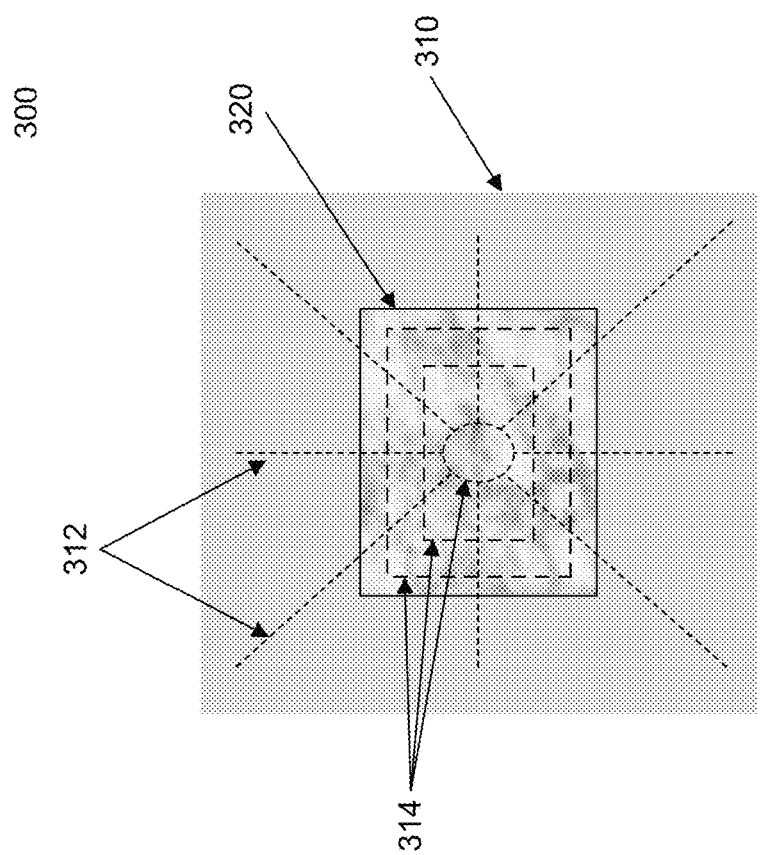
FIG. 3 illustrates a top-down sectional view of an IC package having micro-channels in accordance with embodiments of the present disclosure.

Further, a micro-channel may be formed into different shapes and/or patterns, as illustrated by FIG. 3 which illustrates a top-down view of an IC package 300 having micro-channels in accordance with embodiments of the present disclosure. FIG. 3 depicts a portion of a heat spreader 310 layered over a die 320. The heat spreader 310 and the die 320 have similar properties and relationships as the heat spreader 210 and the die 220, respectively. Accordingly, only distinguishing features will be discussed. In this case, the heat spreader 310 includes a micro-channel pattern having straight micro-channels 312 and/or shaped micro-channels 314. For example, as shown by FIG. 3, the shaped micro-channels 314 have a circular and/or rectangular footprint or shape within the heat spreader 210, as shown. In general, straight micro-channels 312 can provide a direct escape and return route for TI material from a predetermined area, while, in comparison, a shaped micro-channel such as a circular or rectangular shape can provide a reservoir area for a straight micro-channel to store the TI material. Therefore, shaped micro-channels 314 may be any shape or footprint that can provide a reservoir area for TI material. Further, shaped micro-channels 314 is not limited to an enclosed footprint shape and may include an open footprint shape including a straight micro-channel.

Figure 4:
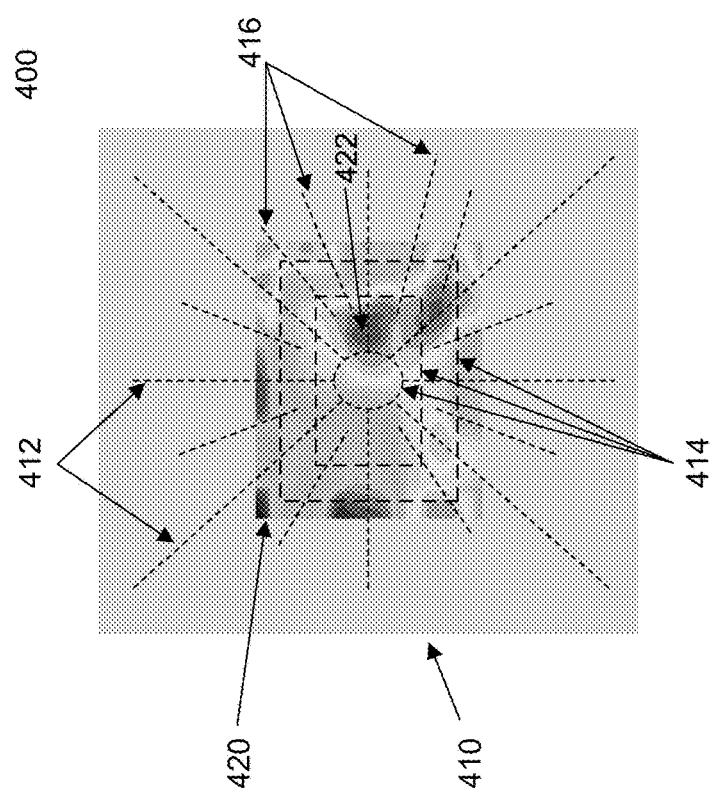
FIG. 4 illustrates another top-down sectional view of an IC package having micro-channels in accordance with embodiments of the present disclosure.

Micro-channels may also be formed to target predetermined thermal hotspots, as shown by FIG. 4 which illustrates another top-down view of an IC package 400 having micro-channels in accordance with embodiments of the present disclosure. FIG. 4 depicts a portion of a heat spreader 410 layered over a die 420. The heat spreader 410 and the die 420 have similar properties and relationships as the heat spreaders 210, 310 and the dies 220, 310, respectively. Accordingly, only distinguishing features will be discussed. In this case, the heat spreader 410 includes straight micro-channels 412 and shaped micro-channels 414 similar to the straight micro-channels 312 and the shaped micro-channels 314 illustrated by FIG. 3. The heat spreader 410 also includes additional straight micro-channels 416 which may be positioned according to additional factors such as known features and functional uses of the IC package 400. For example, the additional straight micro-channels 416 may be formed based on potential thermal hotspots 422 of the die 420 which are predetermined based on a simulations or experimentations of the die 420 that can be run prior to the design and formation of micro-channels on the heat spreader 410. Based on the results of the simulation or experimentations, the additional straight micro-channels 416 may be arranged on the heat spreader 410 to extend from the potential thermal hotspots 422 and/or an area surrounding the potential thermal hotspots 422 to the perimeter of the die 420, as illustrated by FIG. 4.

In considering the location of the additional straight micro-channels 416, additional factors of the potential thermal hotspot 422 may be used, such as a size and/or a location of the potential thermal hotspots 422. Furthermore, additional factors may be used in determining a number of micro-channels 416 that are needed to cool potential thermal hotspots 422. In other words, a single additional straight micro-channel 416 or multiple additional straight micro-channels 416 may be used to target and extend from the potential thermal hotspot 422. Accordingly, the arrangement and/or shapes of micro-channels is not limited to those depicted by FIGS. 2B, 3, and 4 and may be any arrangement and/or shape that provides the desired use of the micro-channels to affect the flow of TI material as desired.

Figure 5:
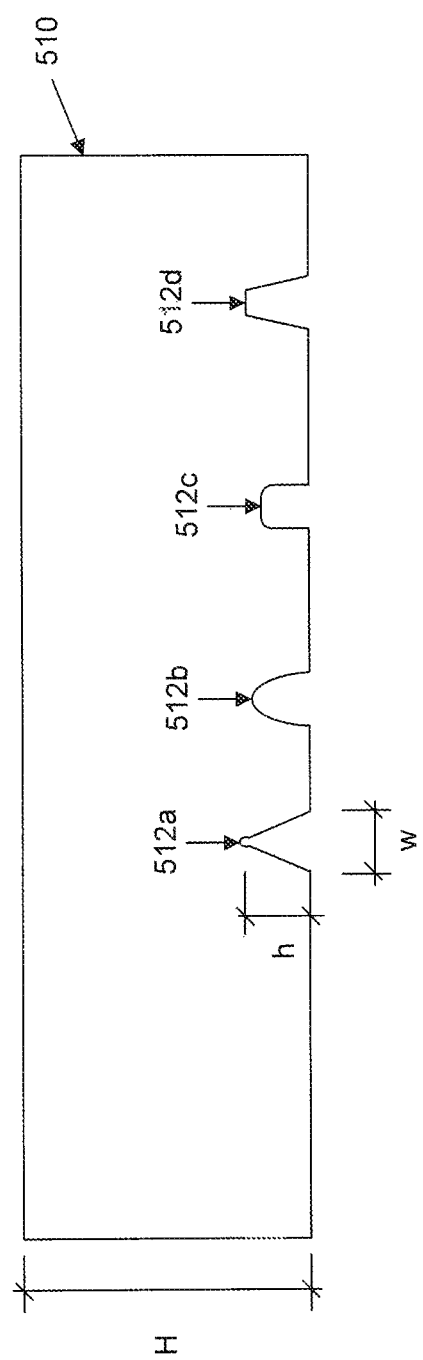
FIG. 5 illustrates a cross-sectional view of a heat spreader in accordance with embodiments of the present disclosure.

A surface of a micro-channel may also be formed into a variety of shapes. For example, FIG. 5 illustrates a cross-sectional view of a heat spreader 510 illustrated in accordance with embodiments of the present disclosure. The heat spreader 510 includes micro-channels having different cross-section shapes, namely: a triangle 512a, an oval 512b, another oval 512c, and a trapezoid 512d. However, the cross-section shape of a micro-channel is not limited to those depicted by FIG. 5. Accordingly, any surface shape which provides at least a portion of the desired uses and benefits of a micro-channel may be used.

Further, a mouth width "w" of a micro-channel, a depth "h" of the micro-channel, and a height "H" of the heat spreader 510 may be considered when designing the heat spreader 510. For example, for the heat spreader 510 having a typical height H of 0.5 mm to 1 mm, the width w of the micro-channel may be less than 1 mm (e.g., of 20 µm to 200 µm) and the depth h of the micro-channel may be 20 µm to 200 µm. Furthermore, the ratio of the depth h of the micro-channel to the height H of heat spreader 510 may be less than one half (½), in consideration of such factors as cost of manufacturing, strength of the heat spreader 510, and/or flow of TI material to and from a predetermined area of a die. Other dimensions may be used for the micro-channel as will be understood by those skilled in the arts.

Figure 6:
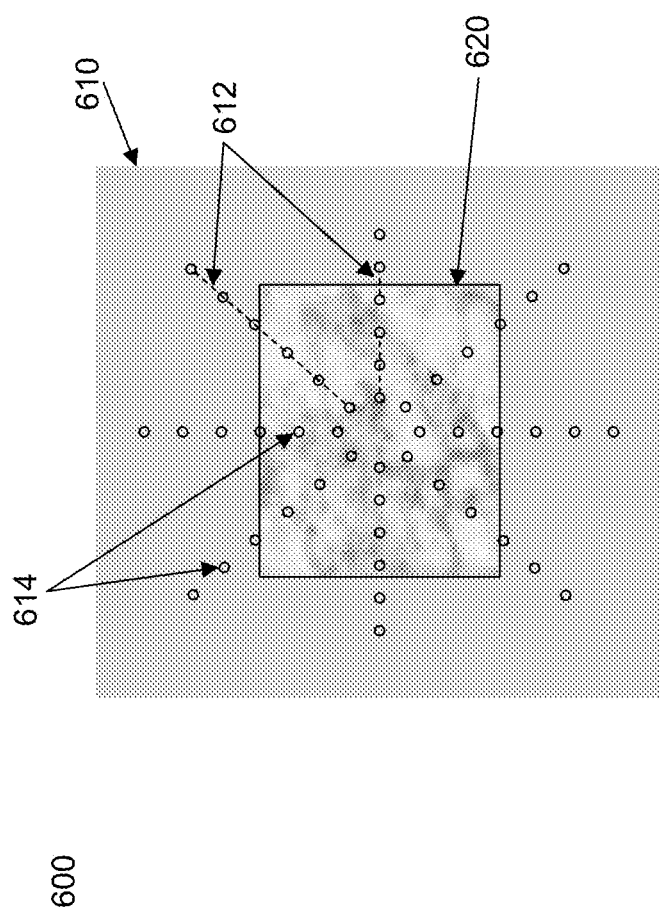
FIG. 6 illustrates a top-down sectional view of an IC package having micro-dents in accordance with embodiments of the present disclosure.

Micro-recesses may also be formed by micro-dents as depicted by FIG. 6 which illustrates a top-down view of an IC package 600 having micro-dents in accordance with embodiments of the present disclosure. FIG. 6 depicts a portion of a heat spreader 610 layered over a die 620. The heat spreader 610 and the die 620 have similar properties and relationships as the heat spreader 210, 310, 410 and the die 220, 320, 420, respectively. Accordingly, only distinguishing features will be discussed. In this case, the heat spreader 610 includes micro-dents 614 that are indented into the material that forms heat spreader 610, and which may form, for example, canonical and/or rectangular shapes. In general, the micro-dents 614 may provide similar functionality as micro-channels by affecting the flow of TI material towards and/or away from a predetermined area of the die 620. However, a micro-dent 614 does not direct a flow of TI material from one area of the die 620 towards another area of the die 620. Instead, each micro-dent 614 provides a reservoir to store TI material at a particular area of the die 620. The micro-dents 614 may be arranged in similar patterns, shapes, and locations as described for micro-channels. For example, the micro-dents 614 may be arranged near a potential thermal hotspot based on a simulation/experimentation, or the micro-dents 614 may be arranged at or near a predetermined area based on an amount of TI material the micro-dents 614 can store.

Further, the micro-dents 614 may be connected to micro-channels 612. In other words, the micro-dents 614 may be connected to the micro-channels 612 to provide better flow of the TI material to and/or away from a predetermined area of the die 620. The arrangement of the micro-dents 614 and the micro-channels 612 is not limited to those depicted by FIG. 6. For example, a single micro-dent may be connected to a single micro-channel, multiple micro-dents may be connected to a micro-channel, or any other combination of micro-dents and micro-channels may be used.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be appreciated that the Detailed Description section, and not the Summary and Abstract sections, is intended to be used to interpret the claims. The Abstract section may set forth one or more but not all exemplary embodiments of the present disclosure as contemplated by the inventor(s), and thus, is not intended to limit the present disclosure and the appended claims in any way.

What is claimed is:

1. An integrated circuit (IC) package, comprising:
   a substrate having a first surface;
   an IC die having opposing first and second surfaces, the first surface of the IC die coupled to the first surface of the substrate; and
   a heat spreader having a first surface coupled to the second surface of the IC die by a thermal interface (TI) material, the first surface of the heat spreader including a micro-recess configured to affect a flow of TI material towards or away from a predetermined area of the second surface of the IC die based on a temperature of the substrate, the IC die, or the heat spreader,
   wherein the micro-recess includes a textured surface having a flow resistance for the TI material flowing towards the predetermined area that is less than a flow resistance for the TI material flowing away from the predetermined area.

2. The IC package of claim 1, wherein the micro-recess is a micro-channel on the first surface of the heat spreader configured to direct the flow of the TI material towards or away from the predetermined area.

3. The IC package of claim 2, wherein the micro-channel extends from the predetermined area of the second surface of the IC die to or beyond an edge of the second surface of the IC die.

4. The IC package of claim 2, wherein the micro-channel is formed into a shape on the first surface of the heat spreader.

5. The IC package of claim 2, wherein the micro-channel includes a shaped micro-channel and a straight micro-channel.

6. The IC package of claim 5, wherein the straight micro-channel intersects with the shaped micro-channel.

7. The IC package of claim 5, wherein the straight micro-channel connects to the shaped micro-channel and extends to or beyond an edge of the second surface of the IC die.

8. The IC package of claim 2, wherein a cross-sectional shape of the micro-channel is one of a V-shape, a half oval shape, a rectangular shape, or a trapezoidal shape.

9. The IC package of claim 2, wherein a cross-sectional depth of the micro-channel is less than half a cross-sectional height of the heat spreader.

10. The IC package of claim 1, wherein the predetermined area of the second surface of the IC die is an area having a known thermal hotspot.

11. The IC package of claim 1, wherein the micro-recess is formed by a surface removal method.

12. The IC package of claim 1, wherein the micro-recess extends from an outer portion of the predetermined area of the second surface of the IC die to or beyond an edge of the second surface of the IC die.

13. The IC package of claim 1, wherein the micro-recess is a micro-dent configured to store the TI material.

14. The IC package of claim 13, wherein the micro-dent is one of a conical shape, an oval shape, or a rectangular shape.

15. The IC package of claim 1, wherein the micro-recess is a micro-channel connected to a micro-dent.

16. The IC package of claim 1, wherein the micro-recess is arranged in a pattern based on a location of a predetermined thermal hotspot of the second surface of the IC die and the micro-recess facilitates retention of the TI material at the location of the predetermined thermal hotspot.

17. An integrated circuit (IC) package, comprising:
an IC die;
thermal interface (TI) material; and
a heat spreader comprising a first surface configured to couple to a surface of the IC die through the TI material, the first surface of the heat spreader comprising a micro-recess configured to direct a flow of the TI material towards or away from a predetermined area of the IC die based on a temperature of the IC die and the heat spreader,
wherein the micro-recess includes a textured surface having a flow resistance for the TI material flowing towards the predetermined area that is less than a flow resistance for the TI material flowing away from the predetermined area.

18. The IC package of claim 17, wherein the micro-recess is a micro-channel.

19. The IC package of claim 17, wherein the micro-recess is a micro-dent.

20. The IC package of claim 17, further comprising:
a reservoir of the TI material disposed along an edge of the IC die and aligned with an end of the micro-recess.

* * * * *